US011177932B1

(12) United States Patent
Rao et al.

(10) Patent No.: US 11,177,932 B1
(45) Date of Patent: Nov. 16, 2021

(54) SYSTEM FOR GENERATING MULTI PHASE CLOCKS ACROSS WIDE FREQUENCY BAND USING TUNABLE PASSIVE POLYPHASE FILTERS

(71) Applicant: Faraday Technology Corp., Hsin-Chu (TW)

(72) Inventors: Vinay Suresh Rao, Karnataka (IN); Andrew Chao, Beaverton, OR (US)

(73) Assignee: Faraday Technology Corp., Hsin-Chu (TW)

( * ) Notice: Subject to any disclaimer, the term of this patent is extended or adjusted under 35 U.S.C. 154(b) by 0 days.

(21) Appl. No.: 17/234,832

(22) Filed: Apr. 20, 2021

(51) Int. Cl.
*H04L 7/033* (2006.01)
*H03M 9/00* (2006.01)
*H03H 17/02* (2006.01)

(52) U.S. Cl.
CPC ....... *H04L 7/0338* (2013.01); *H03H 17/0273* (2013.01); *H03M 9/00* (2013.01)

(58) Field of Classification Search
CPC .......... H03H 2007/0192; H03H 11/22; H03H 17/0273; H03H 7/21; H03H 2011/0494; H03M 9/00; H04L 7/0337; H04L 7/0338; H04L 7/0025; H04L 7/033; H04L 7/00; H04L 7/002
See application file for complete search history.

(56) References Cited

U.S. PATENT DOCUMENTS

| 8,754,678 B1 * | 6/2014 | Schell ................... H03K 3/012 327/129 |
| 9,252,743 B2 * | 2/2016 | Song ......................... G06F 1/04 |
| 2006/0178126 A1 * | 8/2006 | Thompson ............... H04B 1/30 455/333 |
| 2014/0086364 A1 * | 3/2014 | Schell ...................... H03H 7/21 375/340 |
| 2014/0093009 A1 * | 4/2014 | Song ................. H04W 56/0035 375/295 |

\* cited by examiner

*Primary Examiner* — Khanh C Tran
(74) *Attorney, Agent, or Firm* — Winston Hsu

(57) ABSTRACT

A clock generation circuit for generating a plurality of output clocks includes: a differential circuit for receiving a single input clock signal and outputting two differential clock signals, and a DC signal; a first polyphase filter for generating four clock signals from the differential clock signals which are a quadrature phase apart from each other; a plurality of setting buffers for setting a same DC point for the four clock signals and generating four resultant clock signals; coupled polyphase filters for generating four more clock signals which are a quadrature apart from each other, and outputting the resultant eight clock signals; a phase mixer, for generating eight output clock signals 45 degrees apart from each other; and a plurality of restoration buffers for setting a DC point for each of the eight clock signals and generating eight output clock signals all riding on a same DC point.

6 Claims, 10 Drawing Sheets

SYSTEM FOR GENERATING MULTI PHASE CLOCKS ACROSS WIDE FREQUENCY BAND USING TUNABLE PASSIVE POLYPHASE FILTERS

BACKGROUND OF THE INVENTION

1. Field of the Invention

The invention is directed to a clock generation circuit which generates clocks having multiple phases. More particularly, the invention is directed to a clock generation circuit which generates clocks having multiple phases across a wide frequency band using tunable polyphase filters.

2. Description of the Prior Art

SERDES (Serializer/Deserializer) architecture is a circuit for performing high speed digital data transmission between IC chips. SERDES requires many clocks having multiple phases. Conventional clock generation circuits generate these multiple phases using Phase Interpolators, Phase Locked Loops (PLLs) and/or Delay Locked Loops (DLLs). As the clocks are often generated at different places within the clock generation circuit, the resultant output clocks may contain duty cycle and skew errors. To correct for this, the conventional clock generation circuit also comprises duty cycle correction circuits and quadrature correction, which increases the size, cost and complexity of the entire circuit. In addition, DLLs are closed loop circuits which need start-up and stabilization time in order to lock the clock at a particular frequency, and therefore increase the time required for generating the multiple clocks.

U.S. Pat. No. 8,774,336 teaches a circuit for generating multiple phase clocks using polyphase filters. This circuit requires four input clocks of a single fixed frequency, which cannot be tuned. In order to generate the clocks of different phases, adjacent clocks are generated by the polyphase filters and are sent to phase interpolators to differentially generate clocks of in-between phases. This method of mixing clock phases is complicated.

U.S. Pat. No. 7,733,984 teaches a SERDES circuit using polyphase filter networks using phase rotator circuits. The phase interpolator for generating four phases of a clock will result in skew errors. Furthermore, the polyphase filter can only operate at a fixed frequency.

U.S. Pat. No. 9,350,528 teaches a SERDES circuit using polyphase filter networks, but the clocks generated by phase interpolators require correction of quadrature errors.

There is therefore a need for a clock generation circuit which can generate clocks with multiple phases, wherein the clock generation circuit does not require complex circuitry and the generated clocks have minimum duty cycle and skew errors.

SUMMARY OF THE INVENTION

This in mind, the invention provides a clock generation circuit which uses open loop circuits that can generate clocks having multiple phases from a single input clock.

A clock generation circuit according to an exemplary embodiment for generating a plurality of output clocks for a serializer/deserializer (SERDES) circuit, the plurality of output clocks being of different respective phase angles, comprises: a differential circuit for receiving a single input clock signal and outputting two differential clock signals being 180 degrees apart from each other, and a DC signal representing a DC point of the differential clock signals; a first polyphase filter for receiving the differential output clock signals and the DC signal, and generating four clock signals which are a quadrature phase apart from each other; a plurality of setting buffers for receiving the four clock signals, setting a same DC point for the four clock signals and generating four resultant clock signals; coupled polyphase filters for receiving the four resultant clock signals, generating four more clock signals which are a quadrature apart from each other having a slight skew e with respect to the four resultant signals, and outputting the resultant eight clock signals; a phase mixer, for receiving the eight resultant clock signals, mixing every two adjacent phase signals and generating an intermediate output signal, so that eight output clock signals 45° apart from each other are generated; and a plurality of restoration buffers for receiving the eight clock signals from the phase mixer and setting a DC point for each of the eight clock signals and generating eight output clock signals exactly 45° apart from each other and all riding on a same DC point.

The input clock is a square wave. The clock generation circuit further comprises: a single to differential circuit for receiving the input clock and generating two differential square waves; and a square to sine wave circuit for receiving the two differential square waves, and converting the two differential square waves to two differential sine waves which are output as the two differential clock signals being 180 degrees apart from each other.

The coupled polyphase filters comprise: a second polyphase filter for receiving the four resultant clock signals, performing internal superposition of clock signals of a same phase difference to generate four clock signals with corrected amplitude; and a third polyphase filter for receiving the four clock signals with corrected amplitude and generating the four more clock signals which are a quadrature apart from each other. The four more clock signals and the four clock signals with corrected amplitude are output to the phase mixer as the resultant eight clock signals. The first polyphase filter, the second polyphase filter and the third polyphase filter receive same selection codes for tuning internal circuits according to frequencies of input clock signals. Each polyphase filter comprises a first bank of resistors and a second bank of resistors, and the selection codes select a first plurality of resistors from the first bank and a second plurality of resistors from the second bank for tuning the polyphase filters.

The first polyphase filter comprises low pass filters which allow the DC point from the differential circuit so that the generated four clock signals all ride on the DC point. The invention is power efficient and uses stable open loop circuits.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
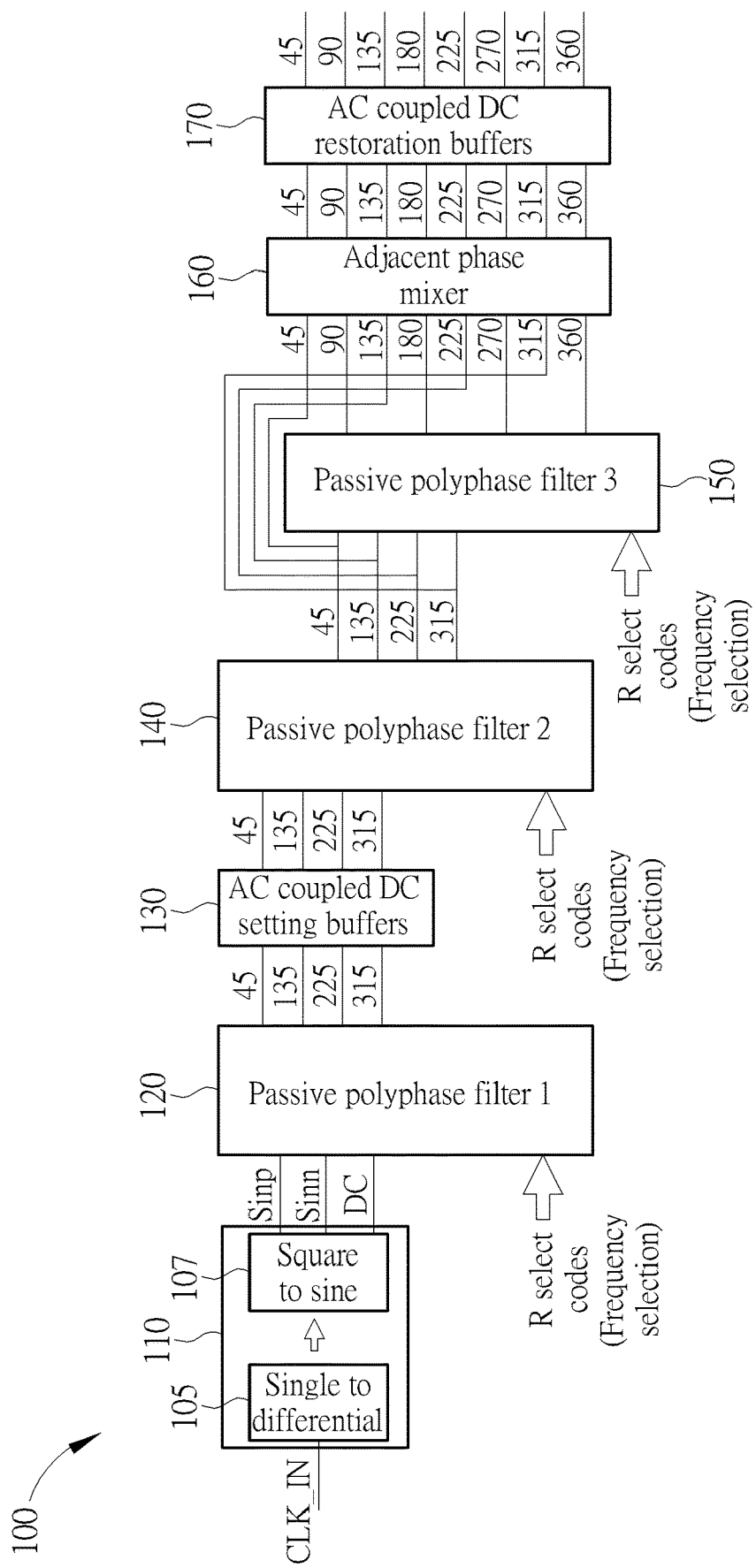
FIG. 1 is a diagram of a circuit for generating multiple phases of an input clock signal according to an exemplary embodiment of the present invention.

FIG. 1 illustrates a circuit 100 for generating eight clock signals of different phases from a single input clock. As shown in the diagram, the circuit 100 comprises a differential circuit 110 comprising a single to differential circuit 105 and a square to sine circuit 107. The differential circuit receives an input clock CLK_IN, which is a square wave. The single to differential circuit 105 generates differential square signals which are then converted to differential sine signals Sinp, Sinn by the square to sine circuit 107. These differential sine signals are sent to a first polyphase filter 120, as well as a DC voltage signal of the differential sine signals. R select codes for frequency selection are also input to the first passive polyphase filter 120, and these codes are used to tune resistors in the passive polyphase filter according to the frequency of the incoming signals. The first passive polyphase filter 120 generates four sine waves which are 90 degrees apart from each other, having respective phases 45, 135, 225, 315. These four sine waves are of different amplitudes, i.e. they are not riding on the same DC level. These four sine waves are input to AC coupled DC setting buffers 130, which set the same DC point for each of the sine waves by rejecting the DC level of the incoming signals.

As these four sine waves will have some quadrature errors, the four sine waves are then input to a second passive polyphase filter 140, which will correct for the quadrature errors and any amplitude mismatches. The second passive polyphase filter 140 also receives R select codes, which are the same codes as those input to the first passive polyphase filter 120. The second passive polyphase filter 140 corrects for amplitude and phase separation so that the four sine waves output will be clean signals which are exactly 90 degrees apart from each other. These clean signals are input to a third passive polyphase filter 150, which similarly receives the same R select codes input to the first passive polyphase filter 120 and the second passive polyphase filter 140. The third passive polyphase filter 150 generates four more signals which are also a quadrature (i.e. 90 degrees) apart from each other and are of intermediate phases with respect to the input four signals, such that the third passive polyphase filter 150 outputs four signals of respective phases 90, 180, 270, 360.

As well as being input to the third passive polyphase filter 150, the four sine waves of respective phases 45, 135, 225, 315 are also directly input to adjacent phase mixers 160. There will be an inherent delay between these four signals and the other four signals generated by the third polyphase filter 150 having phases 90, 180, 270, 360. To correct for these skews, the adjacent phase mixers 160 generate an average clock at the output, and then the eight signals are sent to AC coupled DC restoration buffers which are rail to rail converters for setting a DC point.

Figure 2A:
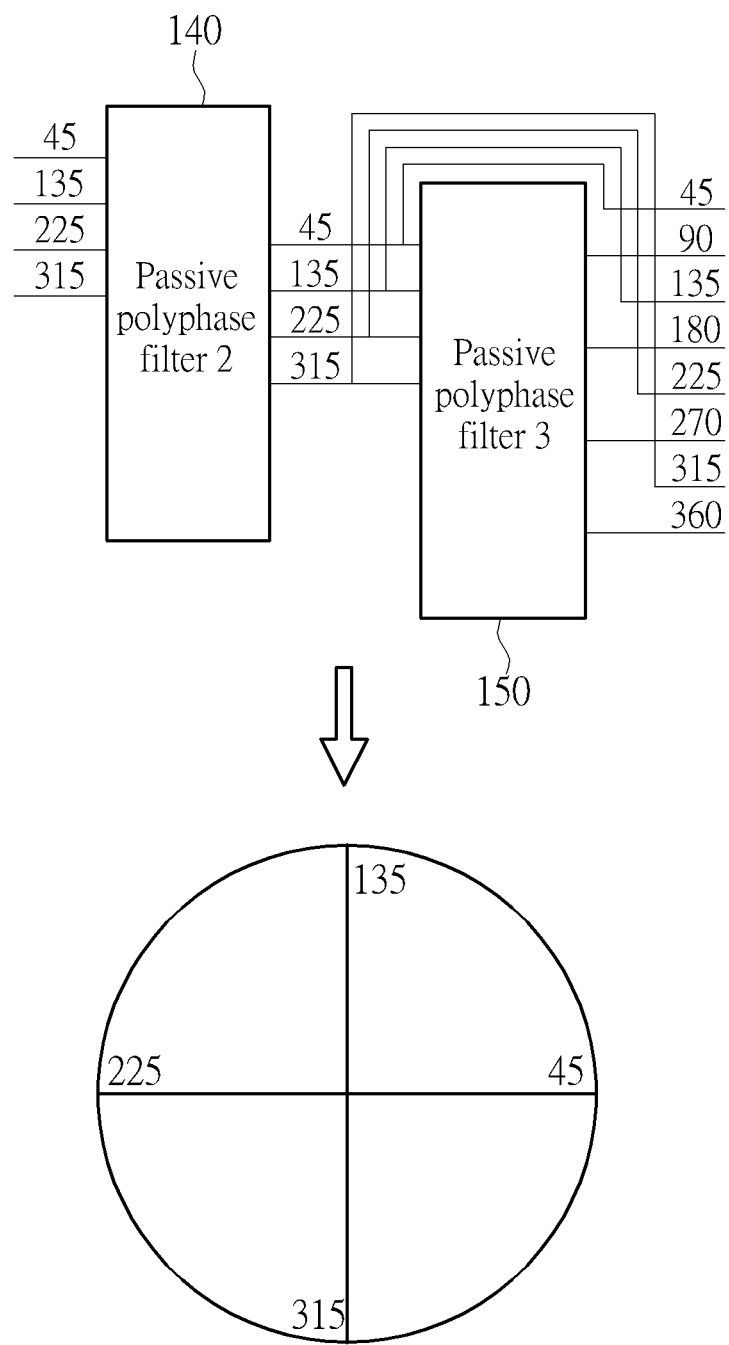
FIG. 2A is a diagram of clock phases generated between a second polyphase filter and a third polyphase filter shown in FIG. 1.
Figure 2B:
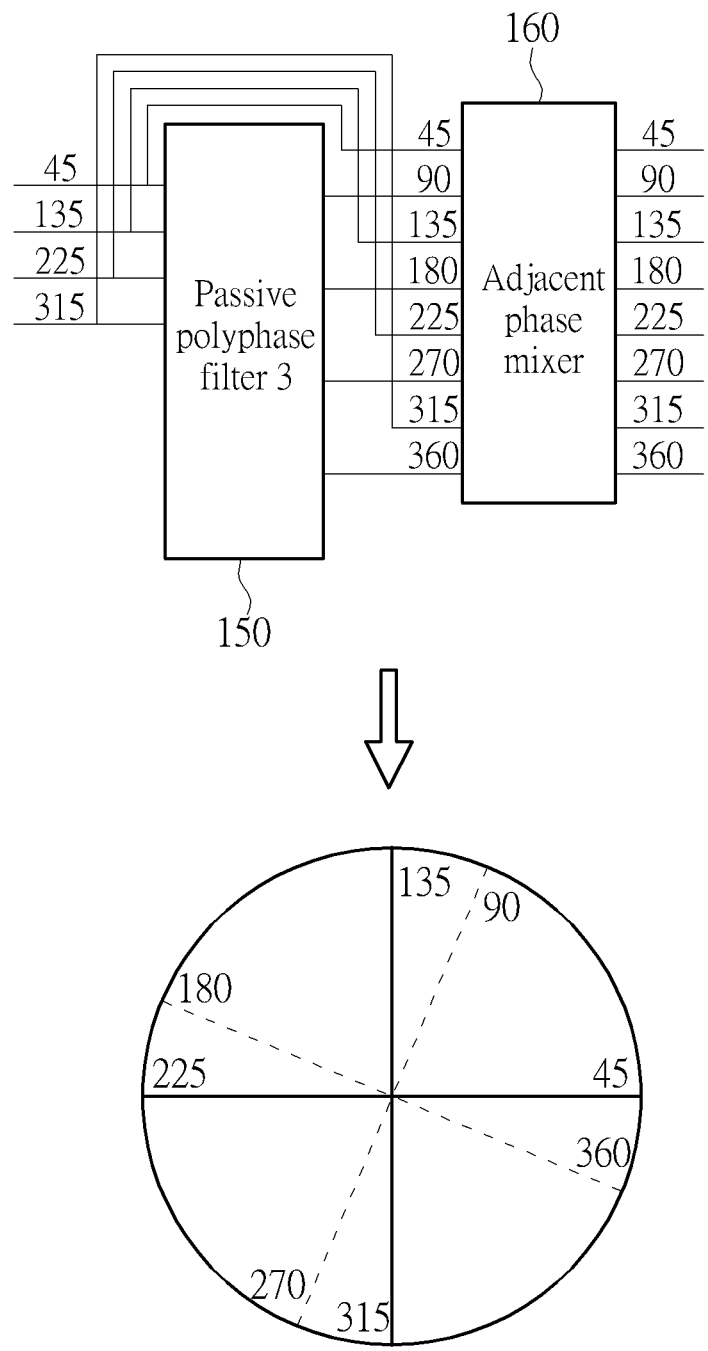
FIG. 2B is a diagram of clock phases generated between the third polyphase filter and an adjacent phase mixer in the circuit shown in FIG. 1.
Figure 2C:
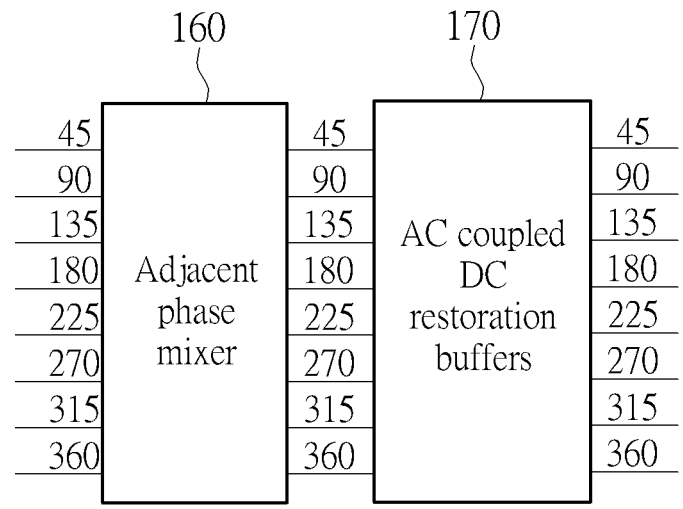
FIG. 2C is a diagram of clock phases generated between the adjacent phase mixer and AC coupled DC restoration buffers in the circuit shown in FIG. 1.
Figure 2C:
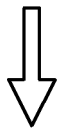
Figure 2C:
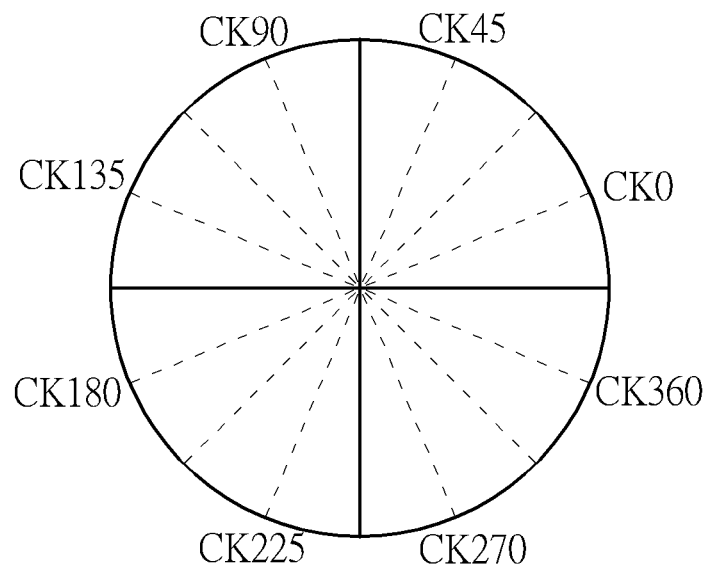

The following will describe the invention in each stage. FIGS. 2A, 2B and 2C illustrate the phases of generated signals output from, respectively, the second passive polyphase filter 140, the third passive polyphase filter 150, and the adjacent phase mixer 160. As shown in FIG. 2A, the four signals having phases 45, 135, 225, 315 are exactly 90 degrees apart from each other. In FIG. 2B, there is a skew between the original four signals and the four more signals having phases 90, 180, 270, 360. In FIG. 2C, all signals have been shifted from the original point so (for example) ck45 is not at 45 degrees with respect to the origin of the chart, but all signals are 45 degrees apart from each other.

Figure 3:
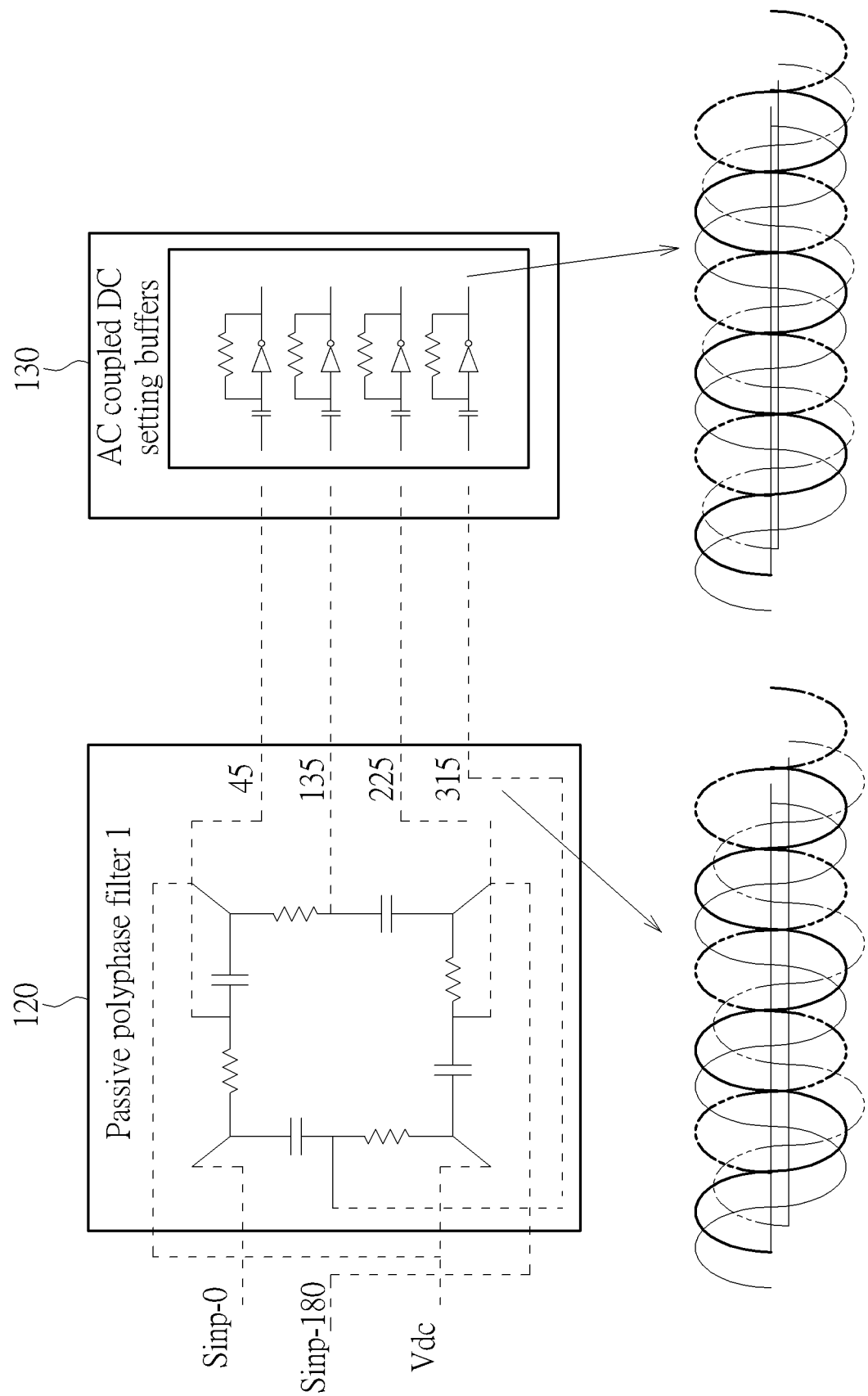
FIG. 3 illustrates the internal components and generated clock signals of a first polyphase filter and AC coupled DC setting buffers in the circuit shown in FIG. 1.

Refer to FIG. 3, which illustrates internal components of the first passive polyphase filter 120 and the AC coupled DC setting buffers 130. Differential sine signals riding on a same DC point are input to the first passive polyphase filter 120. The first passive polyphase filter 120 comprises a high pass filter which will not pass the original DC point, and a low pass filter, which allows the original DC point. There will therefore be a shift between clocks output by the high pass filter and by the low pass filter, as seen in the wave diagram.

As detailed before, the AC coupled DC setting buffers 130 will reject the incoming DC point of all signals by setting their own DC point. As shown in the wave diagram, there is far less shift between the clocks, but there may still be amplitude errors due to inherent irregularities.

Figure 4:
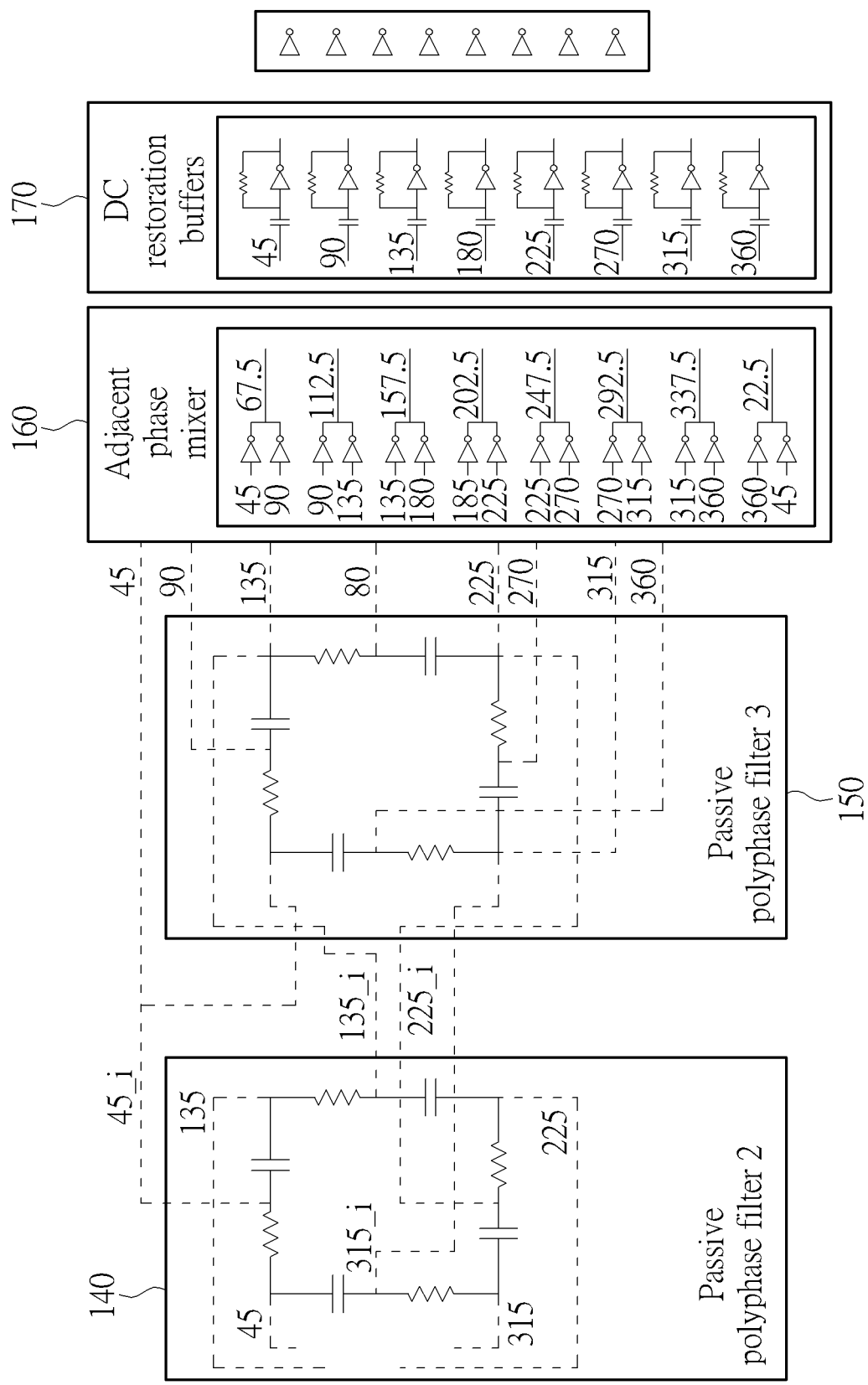
FIG. 4 illustrates the internal components of the second polyphase filter, the third polyphase filter, the adjacent phase mixer and the DC restoration buffers in the circuit shown in FIG. 1.

FIG. 4 illustrates internal components and generated clocks of the second passive polyphase filter 140, the third passive polyphase filter 150, the adjacent phase mixer 160 and the DC restoration buffers 170. The second passive polyphase filter 140 is used to correct for the amplitude errors and irregularities introduced in the clock signals output from the AC coupled DC setting buffers 130. This is achieved by internally generating a second clock for each signal of a specific phase (i.e. 45_i, 135_i, 225_i and 315_i) having different respective amplitudes from the original clock signals of the same phase, and then performing superposition on the pairs of clock signals of the same phase difference, which works to cancel out the differences and thereby generate average output signals exactly 90 degrees apart from each other, as shown in FIG. 2A.

The third passive polyphase filter 150 contains the same internal components as the second passive polyphase filter 140, and is used to generate four more output clocks. As shown in FIG. 2B, the original clocks will be exactly 90 degrees apart from each other, and the newly generated clocks will be exactly 90 degrees apart from each other, but the inherent delay required to generate the four more clocks will result in there being a slight skew between the two groups of four signals. These eight clocks are therefore treated as intermediate clock signals.

The eight intermediate clock signals are input to the adjacent phase mixer 160. As illustrated in FIG. 4, the adjacent phase mixer 160 comprises a plurality of buffer pairs. Each buffer pair receives two signals which are 45 degrees apart, and generates an average output signal. As shown in the diagram, the first buffer pair receives signals 45, 90 and generates a signal 67.5; the second buffer pair receives signals 90, 135, and generates a signal 112.5; the third buffer pair receives signals 135, 180, and generates a signal 157.5; the fourth buffer pair receives signals 180, 225, and generates a signal 202.5; the fifth buffer pair receives signals 225, 270, and generates a signal 247.5; the sixth buffer pair receives signals 270, 315, and generates a signal 292.5; the seventh buffer pair receives signals 315, 360, and generates a signal 337.5; and the eight buffer pair receives signals 360, 45 and generates a signal 22.5. The resultant eight signals are exactly 45 degrees apart. The signal 67.5 is taken as new clock signal 45 which is input to the DC restoration buffer. Please note that this is only for illustrative purposes; signal 67.5 could also be taken as new clock signal 0. What should be noted is that there is exactly 45 degrees phase difference between each pair of successive clock signals. It should also be noted that the eight clock signals generated by the adjacent phase mixer 160 and input to the DC restoration buffers 170 are pure sine waves. This is preferable because there is less duty cycle distortion than in square waves.

Figure 5:
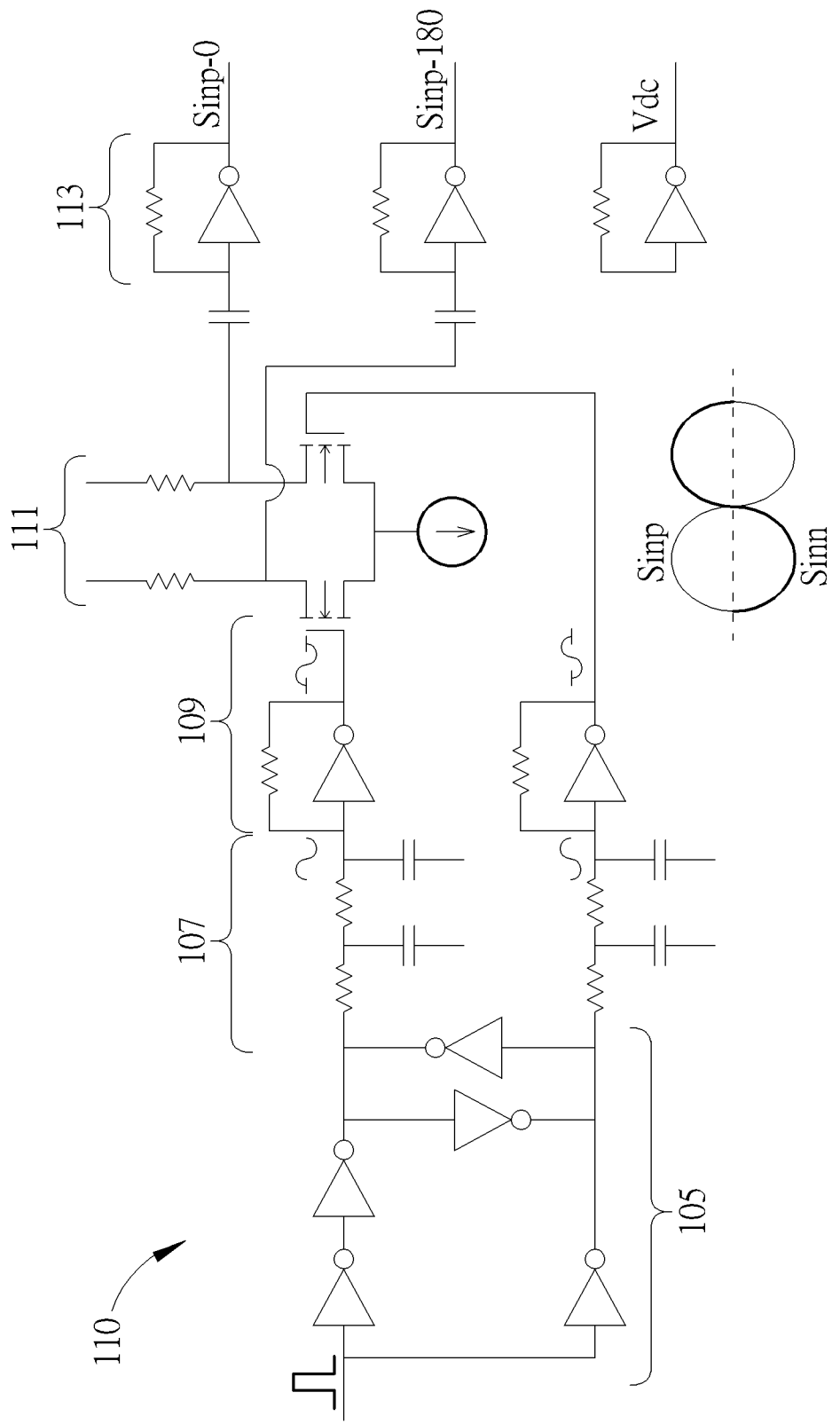
FIG. 5 illustrates the internal components of a single to differential circuit coupled to a square to sine circuit shown in FIG. 1.

FIG. 5 illustrates the internal components of the differential circuit 110, including the single to differential circuit 105 and the square to sine wave circuit 107. The single to differential circuit 105 is formed of a CMOS buffer and inverter coupled to a cross coupled inverter. The cross coupled inverter acts as a latch to restore the duty cycle of the input clock. The square to sine circuit 107 is a second order passive RC filter, and is followed by a DC setting buffer 109 and a differential stage 111, which generates differential sine waves. The differential sine waves are passed through AC coupled DC setting buffers 113, which generate a DC voltage which matches the DC voltage of the differential sine waves. This DC voltage is needed for the passive polyphase filters.

Figure 6A:
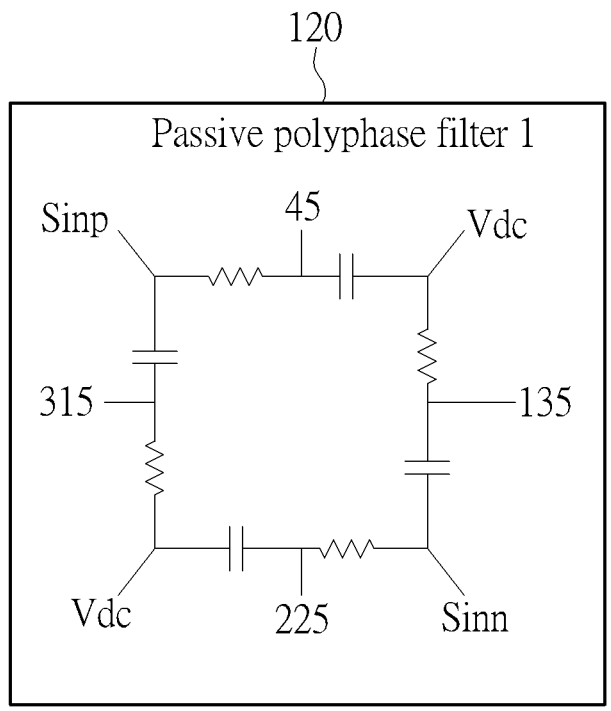
FIG. 6A illustrates internal components and clock phases of the first polyphase filter shown in FIG. 1.
Figure 6B:
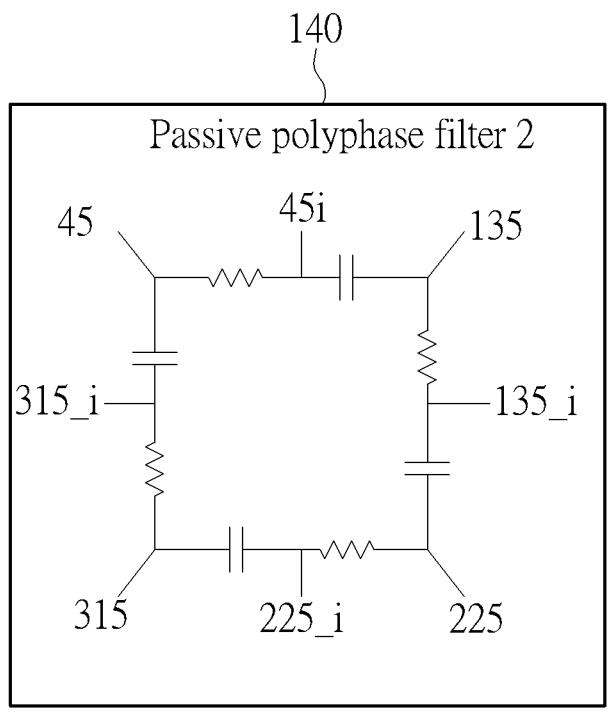
FIG. 6B illustrates internal components and clock phases of the second polyphase filter shown in FIG. 1.
Figure 6C:
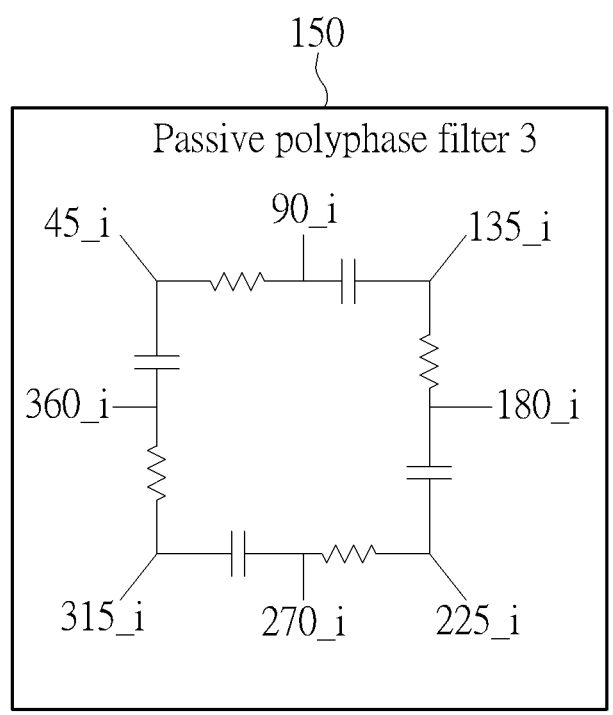
FIG. 6C illustrates internal components and clock phases of the third polyphase filter shown in FIG. 1.

FIGS. 6A, 6B and 6C illustrate the internal components and the clock phases of, respectively, the first passive polyphase filter 120, the second passive polyphase filter 140 and the third passive polyphase filter 150. Details of the clock signal generation has been detailed previously and will not be repeated herein for brevity.

Figure 7:
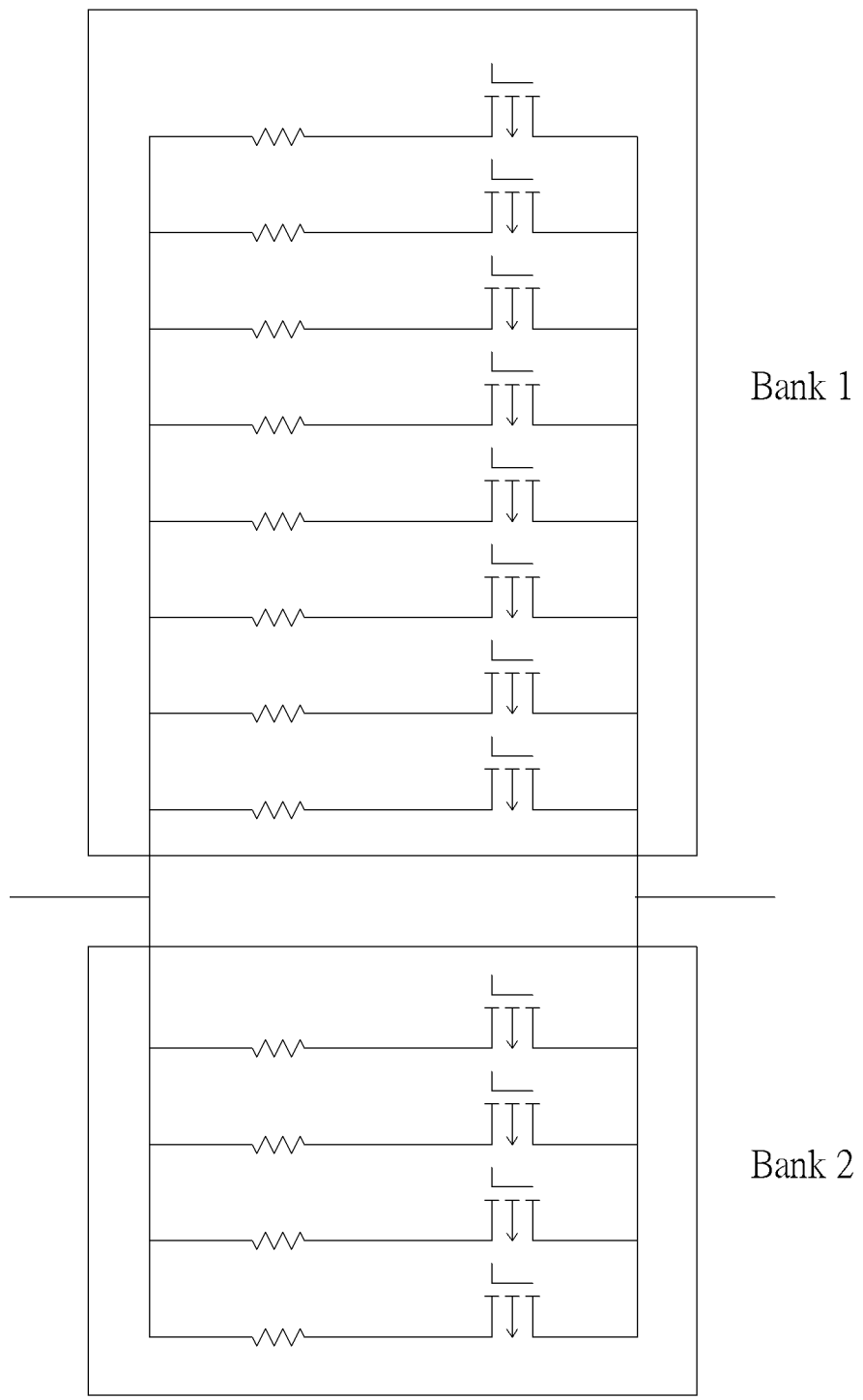
FIG. 7 illustrates a first tunable resistor bank and a second tunable resistor bank of a polyphase filter according to an exemplary embodiment of the present invention.

FIG. 7 illustrates resistor banks in a passive polyphase filter according to an exemplary embodiment of the present invention. As illustrated in the diagram, the passive polyphase filter includes a first bank of resistors BANK 1 and a second bank of resistors BANK 2. Within each bank, the resistors are coupled in parallel. Resistor tuning occurs by turning on one resistor from each bank to form a parallel combination. The resistor selection occurs in a 1 Hot fashion. This allows a total of 8×4 resistor combinations. Please note that the present invention uses the generation of eight clock signals as a preferred embodiment, but the method of the invention can also be applied to generating sixteen clock signals, etc. In this modification, each resistor bank will be modified to increase the number of resistors.

The method and circuit of the invention can generate eight clock signals which are exactly 45 degrees out of phase with each other, having no skew or amplitude variations. By using passive circuits such as passive polyphase filters and passive RC filters, no closed loop circuits are required and therefore no fine tuning of signals is necessary. The absence of closed loop circuits also makes the entire circuit more stable, as no bias settling or start up circuits are required. Further, passive circuits operate at very low power.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A clock generation circuit for generating a plurality of output clocks for a serializer/deserializer (SERDES) circuit, the plurality of output clocks being of different respective phase angles, the clock generation circuit comprising:
a differential circuit for receiving a single input clock signal and outputting two differential clock signals being 180 degrees apart from each other, and a DC signal representing a DC point of the differential clock signals;
a first polyphase filter for receiving the differential output clock signals and the DC signal, and generating four clock signals which are a quadrature phase apart from each other;
a plurality of setting buffers for receiving the four clock signals, setting a same DC point for the four clock signals and generating four resultant clock signals;
coupled polyphase filters for receiving the four resultant clock signals, generating four more clock signals which are a quadrature apart from each other and having a slight skew ⊖ with respect to the four resultant signals, and outputting the resultant eight clock signals;
a phase mixer, for receiving the eight resultant clock signals, mixing every two adjacent phase signals and generating an intermediate output signal, so that eight output clock signals 45 degrees apart from each other are generated; and
a plurality of restoration buffers for receiving the eight clock signals from the phase mixer and setting a DC point for each of the eight clock signals and generating eight output clock signals exactly 45 degrees apart from each other and all riding on a same DC point.

2. The clock generation circuit of claim 1, wherein the input clock is a square wave, and the differential circuit comprises:
a single to differential circuit for receiving the input clock and generating two differential square waves; and
a square to sine wave circuit for receiving the two differential square waves, and converting the two differential square waves to two differential sine waves which are output as the two differential clock signals being 180 degrees apart from each other.

3. The clock generation circuit of claim 1, wherein the coupled polyphase filters comprise:
a second polyphase filter for receiving the four resultant clock signals, performing internal superposition of clock signals of a same phase difference to generate four clock signals with corrected amplitude; and
a third polyphase filter for receiving the four clock signals with corrected amplitude and generating the four more clock signals which are a quadrature apart from each other;
wherein the four more clock signals and the four clock signals with corrected amplitude are output to the phase mixer as the resultant eight clock signals.

4. The clock generation circuit of claim 3, wherein the first polyphase filter, the second polyphase filter and the third polyphase filter receive selection codes for tuning internal circuits according to frequencies of input clock signals, wherein the first polyphase filter, the second polyphase filter and the third polyphase filter receive the same selection codes.

5. The clock generation circuit of claim 4, wherein each polyphase filter comprises a first bank of resistors and a second bank of resistors, and the selection codes select a first plurality of resistors from the first bank and a second plurality of resistors from the second bank for tuning the polyphase filters.

6. The clock generation circuit of claim 1, wherein the first polyphase filter comprises low pass filters which allow the DC point from the differential circuit so that the generated four clock signals all ride on the DC point.

* * * * *